(12) United States Patent
Riggs et al.

(10) Patent No.: US 7,181,384 B1
(45) Date of Patent: Feb. 20, 2007

(54) METHOD AND APPARATUS FOR SIMULATING A HYBRID SYSTEM WITH REGISTERED AND CONCURRENT NODES

(75) Inventors: Adam Schott Riggs, Alameda, CA (US); Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 355 days.

(21) Appl. No.: 10/918,973

(22) Filed: Aug. 16, 2004

(51) Int. Cl.
*G06F 17/50* (2006.01)

(52) U.S. Cl. ...................................................... 703/14
(58) Field of Classification Search ................. 703/14; 716/4; 706/921; 714/741
See application file for complete search history.

(56) References Cited

U.S. PATENT DOCUMENTS

| | | | | |
|---|---|---|---|---|
| 3,832,534 | A * | 8/1974 | Carlson et al. | 703/18 |
| 5,920,712 | A * | 7/1999 | Kuijsten | 703/23 |
| 5,943,637 | A * | 8/1999 | Okumura et al. | 702/111 |
| 6,691,301 | B2 * | 2/2004 | Bowen | 717/114 |
| 6,785,873 | B1 * | 8/2004 | Tseng | 716/4 |
| 7,031,899 | B2 * | 4/2006 | Hsu et al. | 703/15 |

* cited by examiner

*Primary Examiner*—Albert W. Paladini
(74) *Attorney, Agent, or Firm*—L. Cho

(57) ABSTRACT

A method for performing simulation on a circuit includes simulating registered and concurrent nodes in the circuit. Only concurrent nodes that are associated with a concurrent feedback loop are simulated until outputs of the concurrent nodes that are associated with the concurrent feedback loop reach a steady state.

23 Claims, 6 Drawing Sheets

METHOD AND APPARATUS FOR SIMULATING A HYBRID SYSTEM WITH REGISTERED AND CONCURRENT NODES

TECHNICAL FIELD

The present invention relates to the field of system level electronic design automation (EDA) tools. More specifically, the present invention relates to a method and apparatus for simulating a hybrid system with registered and concurrent nodes.

BACKGROUND

System level EDA tools allow a designer to model, simulate, and analyze system algorithms. Tools such as Simulink® from MathWorks® allow designers to create, simulate, evaluate, and refine a system design through standard and custom block libraries. A system design may include registered (synchronous) nodes, concurrent (combinatorial) nodes, or a combination of registered and concurrent nodes. A registered node may be, for example, any node that processes its input and makes the resultant output visible on subsequent clock cycles(s) but without any immediately visible change. A concurrent node may be, for example, any combinatorial logic that processes its input and makes the resultant output visible during the same clock cycle the input was received.

Various methods of simulation exist for registered and concurrent designs. For fully registered systems, a static scheduler may be used to simulate clock cycle steps where a predetermined order in which nodes can be simulated is determined to avoid dependencies. This approach does not work for concurrent nodes since the static scheduler is unable to deal with concurrent feedback loops. For concurrent systems, a scheduler that iterates the simulation for a large number of cycles per clock cycle step may be used. The excessive iterations allow concurrent feedback loops to stabilize to their proper values.

In the past, for system designs having a combination of registered and concurrent nodes, concurrent system simulation techniques were used in order to address concurrent feedback loops. This approach, however, was inefficient when a large number of registered nodes were present in the system design. Excessive simulation iterations on nodes that did not contribute to concurrent feedback loops consumed additional computing resources and required a significant amount of time which resulted in slowing the design cycle which was undesirable.

Thus, what is needed is an efficient method and apparatus for simulating a hybrid system with registered and concurrent nodes.

SUMMARY

According to an embodiment of the present invention, registered and concurrent nodes in a system are simulated in a first phase as data is available to the registered and concurrent nodes in the system. In a second phase, concurrent nodes in the system that are associated with a concurrent feedback loop are simulated until their outputs reach a steady state. Registered nodes in the system that are associated with the concurrent feedback loop are then simulated. By only iterating a simulation for concurrent nodes in the system that are in or dependent on the concurrent feedback loop, computing resources and time may be conserved.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of embodiments of the present invention. However, it will be apparent to one skilled in the art that these specific details may not be required to practice the embodiments of the present invention. In other instances, well-known circuits, devices, programs, and procedures are shown in block diagram form to avoid obscuring embodiments of the present invention unnecessarily.

Figure 1:
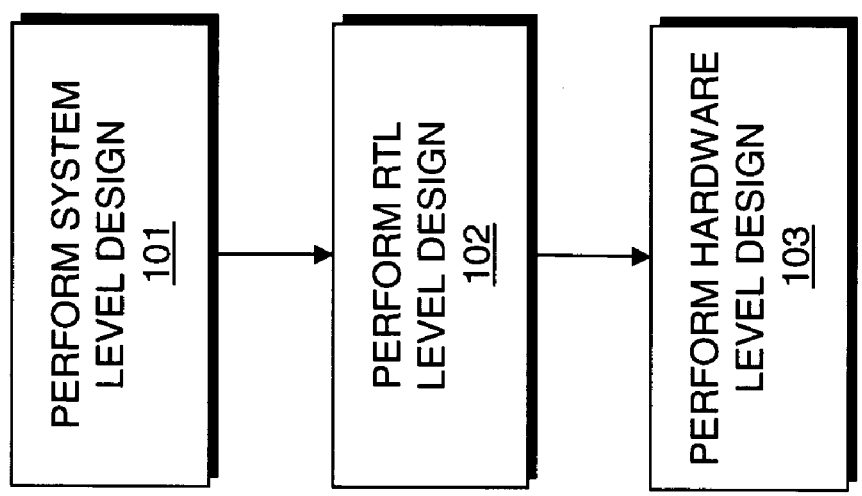
FIG. 1 is a flow chart illustrating a method for designing a system according to an embodiment of the present invention.

FIG. 1 is a flow chart that illustrates a method for designing a system according to an embodiment of the present invention. The method may be performed with the assistance of one or more types of EDA tools. At 101, system level design is performed. System level design involves creating a system design that reflects an abstract level of design of the system. The system level design may include generic blocks that represent general functionalities. The system level design may be performed using a system level EDA tool that allows a designer to create the system design. The system level EDA tool may provide a library of predefined and user-definable blocks, routing tools for connecting blocks together, and simulation tools for running the system design. System level design may involve performing simulation of a system or circuit having a combination of registered and concurrent nodes.

According to an embodiment of the present invention, system level design simulates the combination of registered and concurrent node without iterating the simulation of all of the nodes for a large number of cycles per clock cycle. In this embodiment, nodes that are not associated with a concurrent feedback loop are executed first. Only remaining nodes that are associated with a concurrent feedback loops are iterated until their outputs reach a steady state. A threshold value may be set to determine that a concurrent feedback loop is unstable when the threshold value of iterations has been exceeded. It should be appreciated that the simulation of registered and concurrent node may be performed either by the system level EDA tool or a program external to the system level EDA tool that may be linked via one of the blocks in its library. A system level EDA tool that may be used to perform the system level design at 101 is Simulink®.

At 102, RTL level design is performed. RTL level design involves converting the system design into a hardware design language such as VHDL or Verilog. RTL level design may include further specifying design details of the generic blocks described in the system level design. RTL level design may also include simulating the system design in an RTL simulator. The RTL level design may be performed using a RTL level EDA tool. RTL level EDA tools that may be used to perform the RTL simulation level design at 102 include ModelSim® from Mentor Graphics® and NC Verilog from Cadence® or VCS from Synopsys®.

At 103, hardware level design is performed. Hardware level design involves determining how to implement the system design generated at 101 and 102 onto a physical target device. According to an embodiment of the present invention, the physical target device may be a field programmable gate array (FPGA). In this embodiment, hardware level design involves synthesis, mapping, placement, and routing. Synthesis may include generating a logic design having an optimized logical representation of the system to be implemented by a target device. Mapping may include determining how to implement components such as logic gates and other logic components in the optimized logic representation with resources available on the target device. Placement may include fitting the system on the target device by determining which resources on the target device is to be used for specific components and connections between the components. Routing may include allocating routing resources on the target device to provide interconnections between logic gates, logic elements, and other components on the target device. The hardware level design may be performed using a hardware level design EDA tool. A hardware level design EDA tool that may be used to perform hardware level design include Quartus® by Altera® Corporation.

Figure 2:
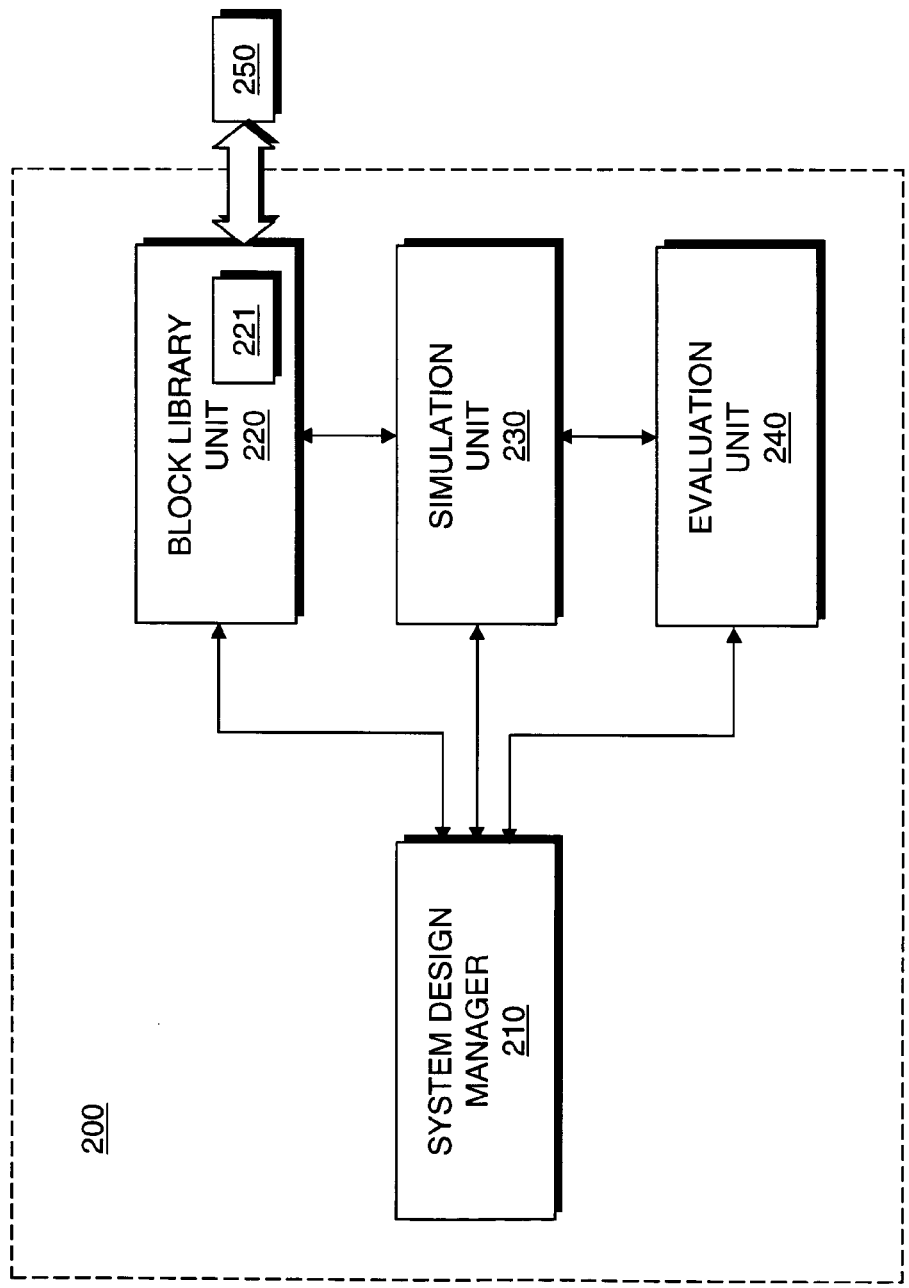
FIG. 2 illustrates a system level EDA tool according to an embodiment of the present invention.

FIG. 2 illustrates a system level EDA tool 200 according to an embodiment of the present invention. The system level EDA tool 200 may be implemented to perform the system level design described with reference to 101 (shown in FIG. 1). The system level EDA tool 200 includes a system design manager 210. The system design manager 210 interfaces with other modules in the system level EDA tool 200 and includes a graphical user interface that allows a designer to select and operate features provided by the other modules in the system level EDA tool 200.

The system level EDA tool 200 includes a block library unit 220. The block library unit 220 includes a plurality of blocks that implement commonly required modeling functions. These may include, for example, application-specific block sets for digital signal processing, fixed-point, communications, and other types of systems. The system level EDA tool 200 allows custom code to be incorporated as blocks in the block library unit 220 through system functions provided by the system level EDA tool 200. The blocks in the block library unit 220 may be used to generate a system design.

The system level EDA tool 200 includes a simulation unit 230. The simulation unit 230 allows a designer to run simulations on a system design created and view results generated by the simulated system design. The simulation unit 230 may include integration algorithms suited for continuous-time (analog), discrete-time (digital), hybrid, mixed-signal, and multi-rate simulations. The simulation unit 230 may also include debugging tools that allow a designer to locate and diagnose errors in the system design.

The system level EDA tool 200 includes an evaluation unit 240. The evaluation unit 240 allows a designer to analyze and test a system design. The evaluation unit 240 may include tools that perform linearization, equilibrium point determination, parameter optimization, and parametric analysis. The evaluation unit 240 may also include tools to help a designer to generate test conditions and validate the system design's performance.

According to an embodiment of the system level EDA tool 200, the block library unit 220 includes a sub-system design block 221. The sub-system design block 221 may include a system that is in an RTL level design. The system may include one or more circuits. The sub-system design block 221 may be selected from the block library unit 220 to be used in the system design. When the sub-system design block 221 is used, the sub-system design block 221 is run using a scheduler unit 250. The scheduler unit 250 simulates the system represented by the sub-system design block 221 and generates outputs for each clock cycle. According to an embodiment of the present invention where the system level EDA tool 200 is Simulink®, an application program interface such as S-Mex may be used to link the sub-system level model 221 in the block library unit 220 with the scheduler unit 250.

Figure 3:
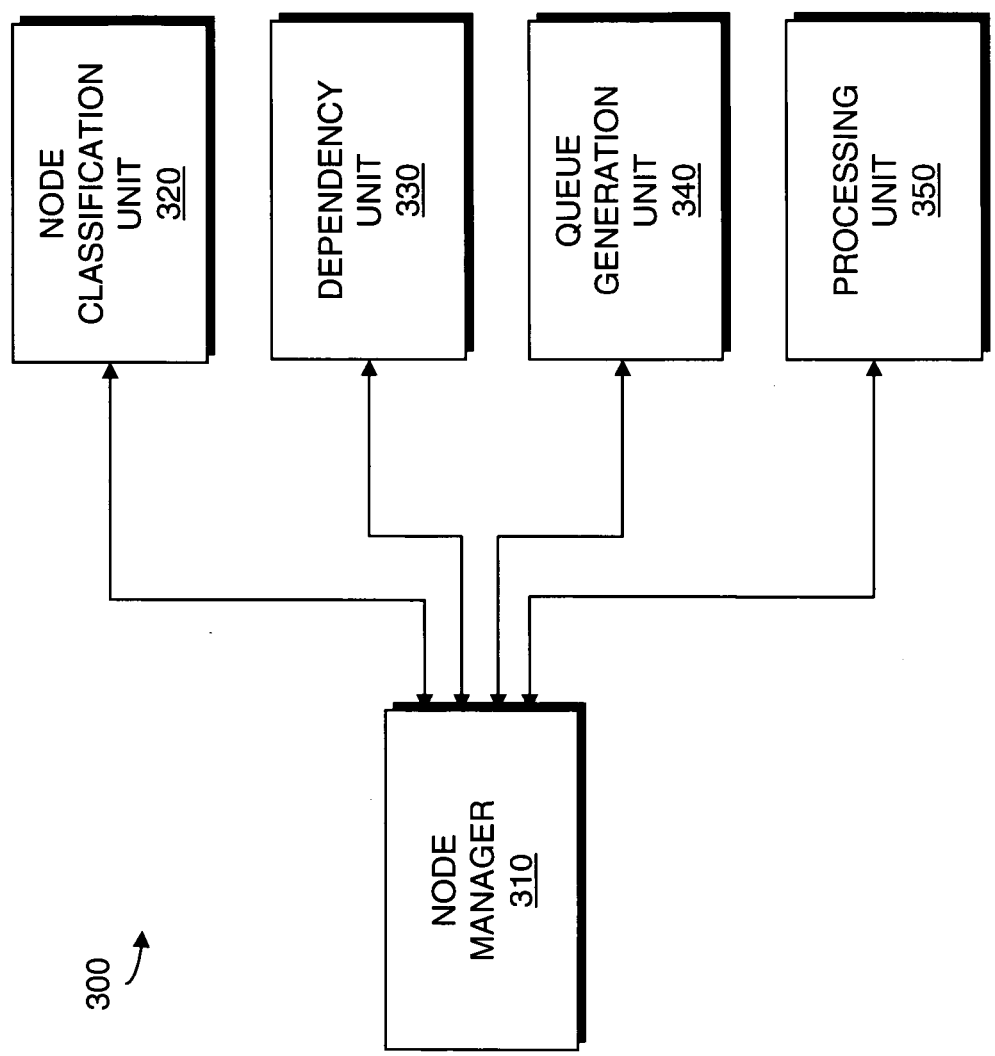
FIG. 3 illustrates a scheduler unit according to an embodiment of the present invention.

FIG. 3 illustrates a scheduler unit 300 according to an embodiment of the present invention. The scheduler unit 300 may be used to implement the scheduler unit 250 shown in FIG. 2. The scheduler unit 300 includes a node manager 310. The node manager 310 is coupled to the components in the scheduler unit 300 and manages simulation activities of system. According to an embodiment of the present invention where the scheduler unit 300 is implemented as the scheduler unit 221 (shown in FIG. 2), the node manager 310 may be used to handle function calls and communicate with the system level EDA tool 200 (shown in FIG. 2).

The scheduler unit 300 includes a node classification unit 320. The node classification unit 320 identifies whether nodes in system are registered or concurrent. According to an embodiment of the present invention, a registered node processes its input and makes the resultant output visible on subsequent clock cycle(s) but without any immediately visible change. A concurrent node processes its input and makes the resultant output visible during a same clock cycle its input was received. Perimeter nodes that are inputs to the system may be treated similarly to registered nodes. Perimeter nodes that are outputs of the system may be treated similarly to concurrent nodes.

The scheduler unit 300 includes a dependency unit 330. The dependency unit 330 unit identifies the nodes for which a node is dependent on. According to an embodiment of the scheduler unit 300, the dependency unit 330 generates a table that maps node dependencies by input.

The scheduler unit 300 includes a queue generation unit 340. The queue generation unit 340 generates a queue that includes all the nodes of the system. The position in which a node is placed in a queue determines the order in which the node is processed with respect to other nodes in the system. According to an embodiment of the present invention, the position of a node in a queue is determined based upon the dependencies of the node. For example, a node dependent on a registered node may be placed in a position in the queue where it is processed before a node dependent on a concurrent node. Alternatively, the position of a node in the queue may be based upon knowledge of whether a node is dependent on a node in a concurrent feedback loop. A node not dependent on a node in a concurrent feedback loop may be placed in a position in the queue where it is processed before a node dependent on a node in a concurrent feedback loop.

According to an embodiment of the present invention, the queue generation unit 340 may randomly determine the position of nodes in a queue. It should be appreciated that the scheduling technique described does not require specific ordering of the nodes.

The scheduler unit 300 includes a processing unit 350. During a first phase of simulation, the processing unit 350 attempts to simulate each of the nodes in the queue in an order determined by its position in the queue. If all inputs to a node are available ("ready"), the node's functional model is executed. Executed nodes are removed from the queue and placed on an executed stack. If an input to a node is not available, the node is placed on top of a sentinel in the queue. An input to a node is available if the node is dependent on a node that has already been executed or if the node is dependent on a registered node that has outputs from a previous cycle.

The node manager 310 monitors the progress of the processing unit 350. When a sentinel is hit, the node manager 310 determines that a pass of the queue has been completed. It should be appreciated that the node manager 310 may determine when the queue has been fully processed by using other mechanisms such as a placeholder, a counter, or other mechanisms or techniques. If there are still nodes remaining in the queue, the node manager 310 determines whether any nodes have been executed during the present pass of the queue. If at least one node was executed, the sentinel is reinserted at the top of the queue and the processing unit 350 is directed to continue processing the queue. If no nodes were executed, the node manager 310 determines that the remaining nodes in the queue are associated with (in or dependent on) a concurrent feedback loop.

During a second phase of the simulation, the processing unit 350 simulates the remaining nodes in the queue until the output values of the nodes converge. The remaining nodes may be simulated by executing the nodes using the data at its input, regardless of whether the data is stale. According to an embodiment of the present invention, only concurrent nodes are executed. After the remaining nodes that are concurrent have reached a steady state, they are taken off of the queue and put on the executed stack. The remaining registered nodes may be updated and put on the executed. The order in which nodes were placed on the executed stack may be used as an order in which the nodes are to be executed in future simulations.

The node manager 310 may monitor the number of times the concurrent nodes remaining in the queue are executed. If the concurrent nodes remaining in the queue are executed more than a threshold number of times, the node manager 310 may determine that system includes an unstable feedback loop. The threshold number may be set such that it is greater than a maximum depth of a combinatorial node chain desirable.

Figure 4:
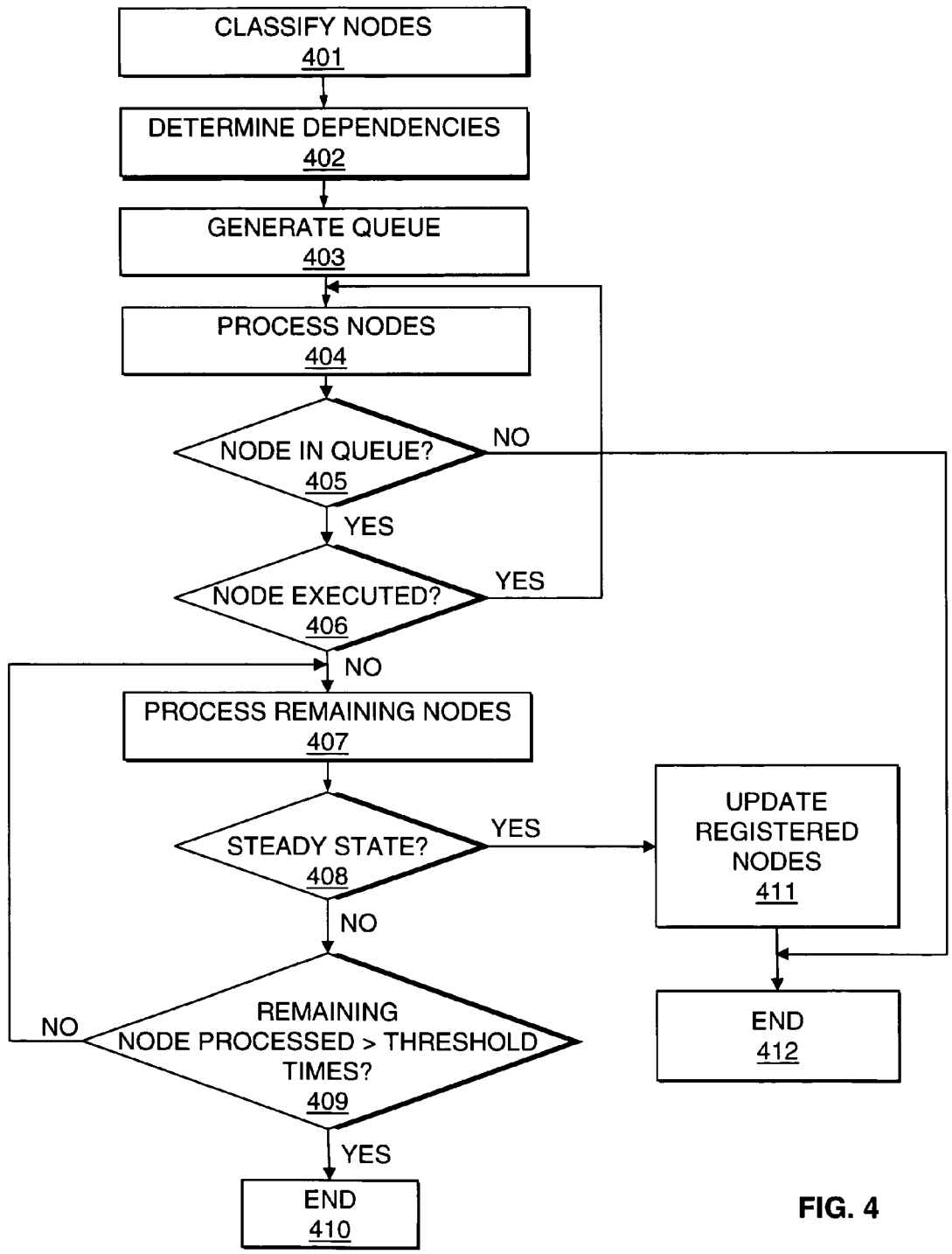
FIG. 4 is a flow chart illustrating a method for simulating a circuit according to an embodiment of the present invention.

FIG. 4 is a flow chart illustrating a method for simulating a system according to an embodiment of the present invention. At 401, nodes in the system are classified. According to an embodiment of the present invention, the nodes are identified as being either registered or concurrent nodes.

At 402, the dependencies of the nodes in the system are determined.

At 403, the nodes in the systems are placed in a queue. The position of the nodes in the queue determines when the nodes are to be processed. According to an embodiment of the present invention, the nodes are placed in the queue according to criteria such as, for example, the dependencies of the nodes and/or whether the nodes are associated with a concurrent feedback loop. According to an alternate embodiment of the present invention, the nodes are placed in the queue in a random order.

At 404, the nodes in the queue are processed. If all inputs to a node are available, the node's functional model is executed. Executed nodes are removed from the queue and placed on an executed stack. If an input to a node is not available, the node is placed on top of a sentinel in the queue. An input to a node is available if the node is dependent on a node that has already been executed or if the node is dependent on a registered node that has outputs from a previous cycle.

At 405, after all nodes in the queue have been processed, it is determined whether there is still a node remaining in the queue. If no node remains in the queue, control proceeds to 412. If a node remains in the queue, control proceeds to 406.

At 406, it is determined whether any nodes had been executed during the previous pass of the queue at 404. If at least one node had been executed, the sentinel is reinserted at the top of the queue and control proceeds to 404 to continue processing the queue. If no nodes were executed, the remaining nodes in the queue are determined to be associated with a concurrent feedback loop and control proceeds to 407.

At 407, the remaining nodes in the queue are simulated. The remaining nodes may be simulated by executing the nodes using the data at its input, regardless of whether the data is stale. According to an embodiment of the present invention, only concurrent nodes are executed.

At 408, it is determined whether the remaining nodes have reached a steady state. According to an embodiment of the present invention, the remaining nodes reach a steady state when their output values converge. The first time that the remaining nodes on the queue are processed at 407, control proceeds to 409. If the remaining nodes have not reached a steady state, control proceeds to 409. If the remaining nodes have reached a steady state, control proceeds to 411.

At 409, it is determined whether the remaining nodes in the queue have been processed more than a threshold number of times. If the remaining nodes in the queue have not been processed more than a threshold number of times, control returns to 407. If the remaining nodes in the queue have been processed more than a threshold number of times, control proceeds to 410.

At 410, it is determined that the system includes an unstable feedback loop and control terminates the simulation.

At 411, the concurrent nodes are taken off of the queue and put on the executed stack. The remaining registered nodes may be updated and put on the executed stack.

At 412, control terminates the simulation for this clock cycle. The order in which nodes were placed on the executed stack may be used as an order in which the nodes are to be executed in future simulations for future clock cycles.

FIGS. 1 and 4 are flow charts illustrating embodiments of the present invention. Some of the techniques illustrated in the figures may be performed sequentially, in parallel or in an order other than that which is described. It should be appreciated that not all of the techniques described are required to be performed, that additional techniques may be added, and that some of the illustrated techniques may be substituted with other techniques.

Figure 5:
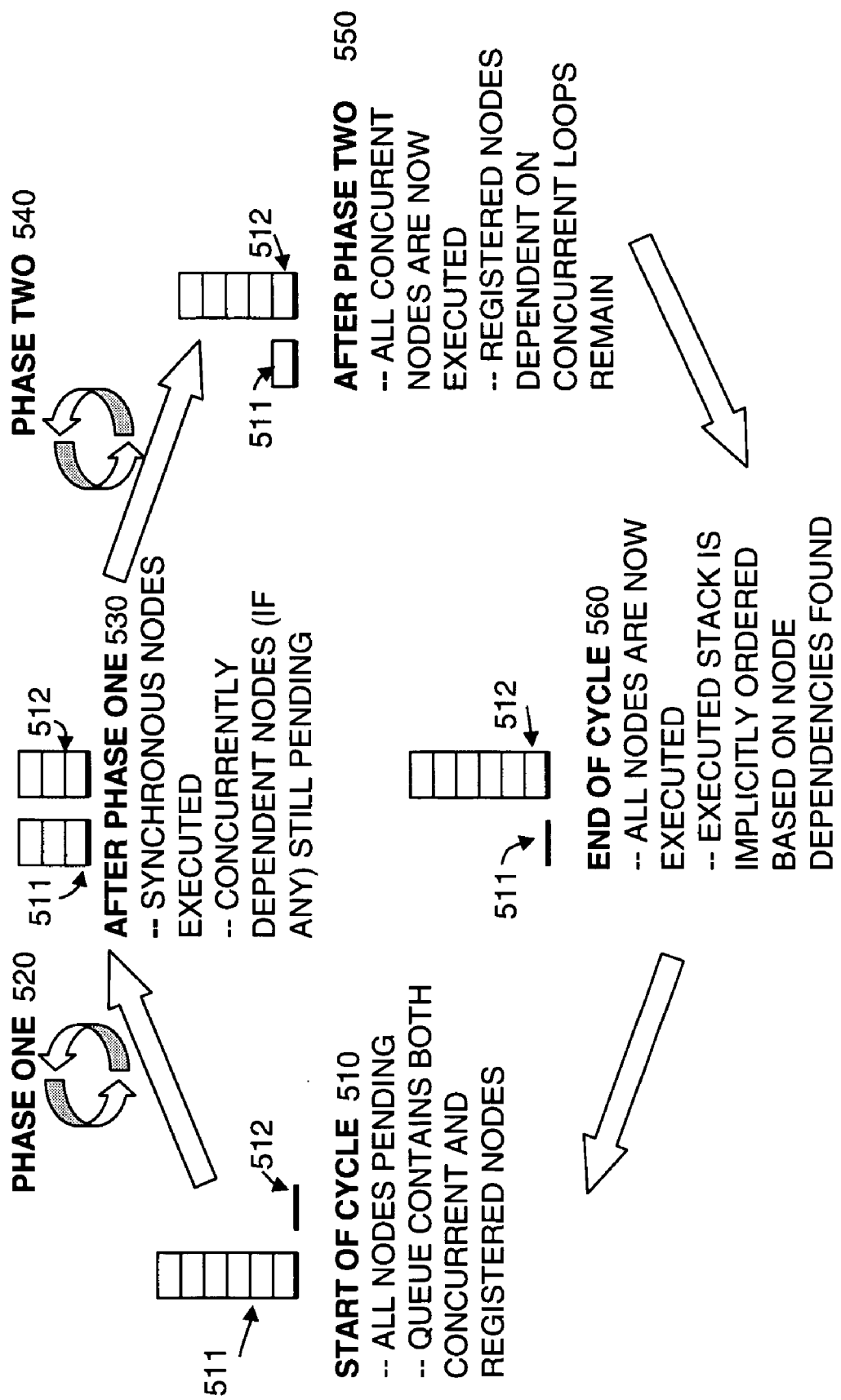
FIG. 5 illustrate a processing cycle for the simulator according to an embodiment of the present invention.

FIG. 5 illustrate a processing cycle for the simulator according to an embodiment of the present invention. The processing cycle may be performed during a single clock cycle and may be repeated for each subsequent clock cycle.

At 510, a start of a cycle is shown. At the start of the cycle, all nodes are pending in a queue 511. The queue 511 contains both concurrent and registered nodes. No nodes are in the executed stack 512. At 520, the nodes in queue 511 are processed during phase 1. At 530, after phase 1 is completed, concurrent and registered nodes that are synchronous have been executed. The executed nodes are placed in the executed stack 512 in the order they were executed. Any concurrently dependent nodes are still pending in the queue 511. At 540, remaining nodes in the queue 511 which are concurrent nodes are executed until they reach a steady state. The remaining nodes in the queue 511 which are concurrent nodes may be executed using data that may include stale data. At 550, after phase 2, all concurrent nodes have been executed. The concurrent nodes that have reached a steady state are placed in the executed stack 512. Registered nodes dependent on concurrent feedback loops remain in the queue 511. At 560, the end of the cycle is shown. The registered nodes dependent on concurrent loops are executed. The executed stack is implicitly ordered based on node dependencies found.

As nodes are executed, they are added to a list of processed nodes in the executed stack. The nodes are added such that they are ordered by their dependencies. In subsequent simulation cycles, this list can be used as the queue of pending nodes. In systems featuring mostly registered nodes, the nodes of the system will be processed in an optimum order.

Figure 6:
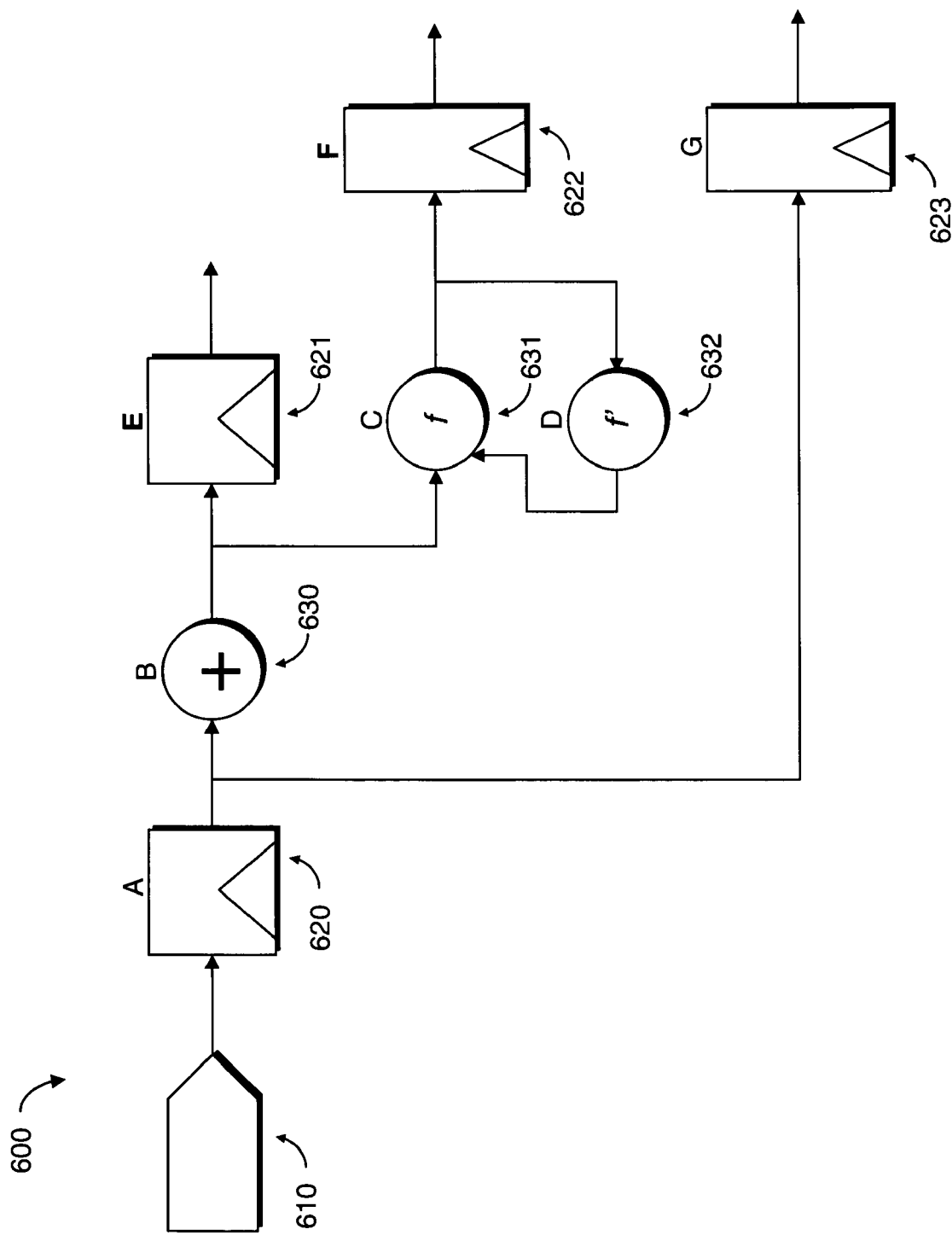
FIG. 6 illustrates an exemplary circuit with which simulation is performed according to an embodiment of the present invention.

FIG. 6 illustrates an exemplary circuit 600 with which simulation is performed according to an embodiment of the present invention. The circuit 600 includes flip-flops 620–623, an adder 630, functional circuits 631 and 632, and input pad 610. With reference to FIG. 4, at 401 nodes 610 and 620–623 (A, E, F, G) are identified as being registered nodes, and nodes 630–632 (B, C, D) are identified as being concurrent nodes.

At 402, it is determined that node A is dependent on the in put pad 610. Node B is dependent on node A. Node C is dependent on nodes B and D. Node D is dependent on node C. Node E is dependent on node B. Node F is dependent on node C. Node G is dependent on node A.

At 403, a queue is generated with nodes G, E, C, A, B, D, and F randomly selected to be placed in a first to seventh position in the queue.

At 404 and 405, nodes G, A, and B are processed and are placed in the executed stack. Nodes E, C, D, and F remain in the queue. Control proceeds to 406.

At 406, since a node was executed at 404, control returns to 404.

At 404 and 405, node E is executed and placed in the executed stack. Nodes C, D, and F remain in the queue. Control proceeds to 406.

At 406, since a node was executed at 404, control returns to 404.

At 404 and 405, no additional node is processed. Nodes C, D, and F remain in the queue.

At 406, since no node was processed at 404, control proceeds to 407.

At 407, the remaining nodes that are concurrent nodes, C and D, are processed until they reach a steady state. Node C is dependent on nodes B and D. Data from node B is available, but data from node D is not. Stale data from node D may be used to execute function f from node C.

At 408, it is assumed for the purposes of this example that nodes C and D reach a steady state. Control proceeds to 411.

At 411, nodes C and D are taken off of the queue and put on the executed stack. The remaining registered node F may be updated and put on the executed list. At 412, control terminates the simulation for this clock cycle. The order in which nodes were placed on the executed list (G, A, B, E, C, D, F) may be used as an order in which the nodes are to be executed in future simulations for future clock cycles.

Embodiments of the present invention may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular hardware or software configuration. They may find applicability in any computing or processing environment. The techniques may be implemented in hardware, software, or a combination of the two.

The term "machine readable medium" used herein shall include any medium that is capable of storing or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for performing simulation on a circuit, comprising:
    simulating registered and concurrent nodes in the circuit; and
    simulating only concurrent nodes that are associated with a concurrent feedback loop until outputs of the concurrent nodes that are associated with the concurrent feedback loop reach a steady state.

2. The method of claim 1, further comprising categorizing nodes in the circuit as being registered or concurrent.

3. The method of claim 1, further comprising generating an order in which the registered and concurrent nodes are to be simulated.

4. The method of claim 3, wherein the order is randomly generated.

5. The method of claim 3, wherein the order is generated based on whether the registered and concurrent nodes are associated with the concurrent feedback loop.

6. The method of claim 3, wherein the registered and concurrent nodes are ordered in a queue.

7. The method of claim 1, wherein simulating registered and concurrent nodes comprises:
    executing registered and concurrent nodes in the circuit that are coupled to registered and concurrent nodes in the system having data available at outputs;
    determining whether any registered or concurrent nodes have been executed;
    executing remaining registered and concurrent nodes in the system that are coupled to registered and concurrent nodes in the circuit having data available at outputs in response to determining that registered or concurrent notes have been executed.

8. The method of claim 7, further comprising:
taking executed registered and concurrent nodes out of a queue; and
placing remaining registered and concurrent nodes above a sentinel in the queue.

9. The method of claim 7, further comprising determining that the remaining registered and concurrent nodes are associated with the concurrent feedback loop in response to determining that any registered or concurrent notes have not been executed.

10. The method of claim 1, further comprising determining that the circuit includes an unstable concurrent feedback loop if the outputs of the registered and concurrent nodes that are associated with the concurrent feedback loop do not reach a steady state after a threshold amount of simulation has been performed.

11. The method of claim 1, further comprising simulating registered nodes associated with the concurrent feedback loop.

12. A machine-readable medium having stored thereon sequences of instructions, the sequences of instructions including instructions which, when executed by a processor, causes the processor to perform:
simulating registered and concurrent nodes in a circuit; and
simulating only concurrent nodes that are associated with a concurrent feedback loop until outputs of the concurrent nodes that are associated with the feedback loop reach a steady state.

13. The machine-readable medium of claim 12, further comprising instructions which when executed by the processor causes the processor to generate an order in which the registered and concurrent nodes are to be simulated.

14. The machine-readable medium of claim 13, wherein the order is randomly generated.

15. The machine-readable medium of claim 13, wherein the order is generated based on whether the registered and concurrent nodes are associated with the feedback loop.

16. The machine-readable medium of claim 13, wherein simulating registered and concurrent nodes comprises:
executing registered and concurrent nodes in the circuit that are coupled to registered and concurrent nodes in the system having data available at outputs;
determining whether any registered or concurrent nodes have been executed;
executing remaining registered and concurrent nodes in the circuit that are coupled to registered and concurrent nodes in the circuit having data available at outputs in response to determining that registered or concurrent notes have been executed.

17. The machine-readable medium of claim 16, further comprising determining that the remaining registered and concurrent nodes are associated with the feedback loop in response to determining that any registered or concurrent notes have not been executed.

18. The machine-readable medium of claim 12, further comprising instructions which when executed by the processor causes the processor to simulate registered nodes associated with the concurrent feedback loop.

19. A scheduler, comprising:
a simulation unit that executes registered and concurrent nodes in a circuit having data available at its inputs; and
a node manager that directs the simulation unit to execute only concurrent nodes that are associated with a concurrent feedback loop until outputs of the concurrent nodes that are associated with the concurrent feedback loop reach a steady state.

20. The scheduler of claim 19, wherein the concurrent nodes that are associated with the concurrent feedback loop are executed using stale data.

21. The scheduler of claim 19, further comprising a node classification unit that identifies whether a node is a registered or concurrent node.

22. The scheduler of claim 19, further comprising a dependency unit that identifies whether nodes coupled to an input of a node are registered or concurrent.

23. The scheduler of claim 19, wherein the simulation unit updates registered nodes associated with the concurrent feedback loop.

* * * * *